(12) United States Patent
Won

(10) Patent No.: US 10,340,436 B2
(45) Date of Patent: Jul. 2, 2019

(54) THERMOELECTRIC ELEMENT, THERMOELECTRIC MODULE, AND HEAT CONVERSION APPARATUS INCLUDING THE SAME

(71) Applicant: LG INNOTEK CO., LTD., Seoul (KR)

(72) Inventor: Boone Won, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/561,830

(22) PCT Filed: Mar. 25, 2016

(86) PCT No.: PCT/KR2016/003075
§ 371 (c)(1),
(2) Date: Sep. 26, 2017

(87) PCT Pub. No.: WO2016/159591
PCT Pub. Date: Oct. 6, 2016

(65) Prior Publication Data
US 2018/0114891 A1 Apr. 26, 2018

(30) Foreign Application Priority Data
Mar. 27, 2015 (KR) .......... 10-2015-0043107

(51) Int. Cl.
*H01L 35/32* (2006.01)
*H01L 35/08* (2006.01)
(Continued)

(52) U.S. Cl.
CPC ........... *H01L 35/325* (2013.01); *H01L 35/02* (2013.01); *H01L 35/08* (2013.01); *H01L 35/30* (2013.01); *H01L 35/32* (2013.01); *H01L 35/34* (2013.01)

(58) Field of Classification Search
CPC ....... H01L 35/325; H01L 35/08; H01L 35/30; H01L 35/34
(Continued)

(56) References Cited

U.S. PATENT DOCUMENTS

2005/0139249 A1* 6/2005 Ueki .................. H01L 35/32
136/211
2009/0007952 A1 1/2009 Kondoh et al.
(Continued)

FOREIGN PATENT DOCUMENTS

JP H10-4217 A 1/1998
JP 2006-032723 A 2/2006
(Continued)

OTHER PUBLICATIONS

International Search Report in International Application No. PCT/KR2016/003075, filed Mar. 25, 2016.
(Continued)

*Primary Examiner* — Jayne L Mershon
(74) *Attorney, Agent, or Firm* — Saliwanchik, Lloyd & Eisenschenk

(57) ABSTRACT

Embodiments of the present invention provide a thermoelectric element including a first element portion having a first cross-sectional area, a connection portion connected to the first element portion, and a second element portion connected to the connection portion and having a second cross-sectional area, wherein a cross-sectional area of the connection portion is smaller than at least one of the first cross-sectional area and the second cross-sectional area.

17 Claims, 8 Drawing Sheets

(51) Int. Cl.
  *H01L 35/30* (2006.01)
  *H01L 35/34* (2006.01)
  *H01L 35/02* (2006.01)
(58) Field of Classification Search
  USPC .......................................................... 136/224
  See application file for complete search history.

(56) References Cited

U.S. PATENT DOCUMENTS

| | | | | |
|---|---|---|---|---|
| 2011/0277801 | A1* | 11/2011 | Fuchs | H01L 35/08 |
| | | | | 136/201 |
| 2012/0145209 | A1* | 6/2012 | Kim | H01L 35/26 |
| | | | | 136/200 |
| 2016/0126438 | A1* | 5/2016 | Marc | H01L 35/10 |
| | | | | 136/204 |

FOREIGN PATENT DOCUMENTS

| | | |
|---|---|---|
| JP | 2011-035250 A | 2/2011 |
| KR | 10-2012-0029196 A | 3/2012 |
| KR | 10-2012-0080820 A | 7/2012 |
| KR | 10-2015-0021366 A | 3/2015 |
| WO | WO-2010/120298 A1 | 10/2010 |
| WO | WO-2013/006246 A1 | 1/2013 |

OTHER PUBLICATIONS

Supplementary European Search Report dated Dec. 12, 2018 in European Application No. 16773372.4.

* cited by examiner

THERMOELECTRIC ELEMENT, THERMOELECTRIC MODULE, AND HEAT CONVERSION APPARATUS INCLUDING THE SAME

CROSS-REFERENCE TO RELATED APPLICATIONS

This application is the U.S. national stage application of International Patent Application No. PCT/KR2016/003075, filed Mar. 25, 2016, which claims priority to Korean Application No. 10-2015-0043107, filed Mar. 27, 2015, the disclosures of each of which are incorporated herein by reference in their entirety.

TECHNICAL FIELD

Embodiments of the present invention relate to a thermoelectric element configured to increase thermoelectric efficiency, a thermoelectric module, and a heat conversion apparatus including the same.

BACKGROUND ART

A general thermoelectric module has a structure in which a pair of PN joints are formed by joining a P-type thermoelectric element and an N-type thermoelectric element among metal electrodes. When a temperature difference exists between both metal electrodes of the pair of PN joints, power is generated by the Seeback effect, and accordingly the thermoelectric module may be a power generator. Also, according to Peltier's effect in which one of both of the metal electrodes of the pair of PN joints is cooled and the other metal electrode is heated, the thermoelectric module may be a temperature controller.

Such a thermoelectric module is applied to a cooler, a warmer, and a generator to provide various thermoelectric effects.

Accordingly, a method of increasing efficiency of a thermoelectric module has drawn attention.

DISCLOSURE OF INVENTION

Technical Problem

An aspect of the present invention is to provide a highly efficient thermoelectric module.

Technical Solution

According to one aspect of the present invention, there is provided a thermoelectric element including a first element portion having a first cross-sectional area, a connection portion connected to the first element portion, and a second element portion connected to the connection portion and having a second cross-sectional area, wherein a cross-sectional area of the connection portion is smaller than at least one of the first cross-sectional area and the second cross-sectional area.

Advantageous Effects

According to embodiments of the present invention, thermoelectric efficiency and power generation efficiency can be increased by forming a top width and a bottom width of a thermoelectric element to be greater than a central width thereof even though an equivalent amount of material is used. Accordingly, a material cost of the thermoelectric element can be reduced while maintaining the power generation efficiency.

Also, according to embodiments of the present invention, cooling or heating performance can be increased using an equivalent amount of material in an apparatus which provides a cooling or heating heat conversion effect. In this case, a material cost of the thermoelectric element can be reduced while obtaining certain cooling and heating performance.

Also, according to embodiments of the present invention, a thin thermoelectric module having high heat emission efficiency can be provided. Particularly, when an area of a heat-emitting substrate is formed to be greater than an area of a cooling substrate, since a heat transfer rate may be increased and a heat sink is not necessary, a small and thin apparatus can be obtained.

Also, according to embodiments of the present invention, since a thermoelectric element is embodied by stacking unit members including a semiconductor layer on a sheet base material, heat conductivity is decreased and electrical conductivity is increased such that a cooling capacity (Qc) and a temperature change rate (OT) can be notably increased. In addition, there are effects of maximizing electrical conductivity by including a conducting pattern layer between unit members of a stacked structure and forming a thickness thereof to be notably less than that of an overall bulk-type thermoelectric element.

BEST MODE FOR INVENTION

Figure 1:
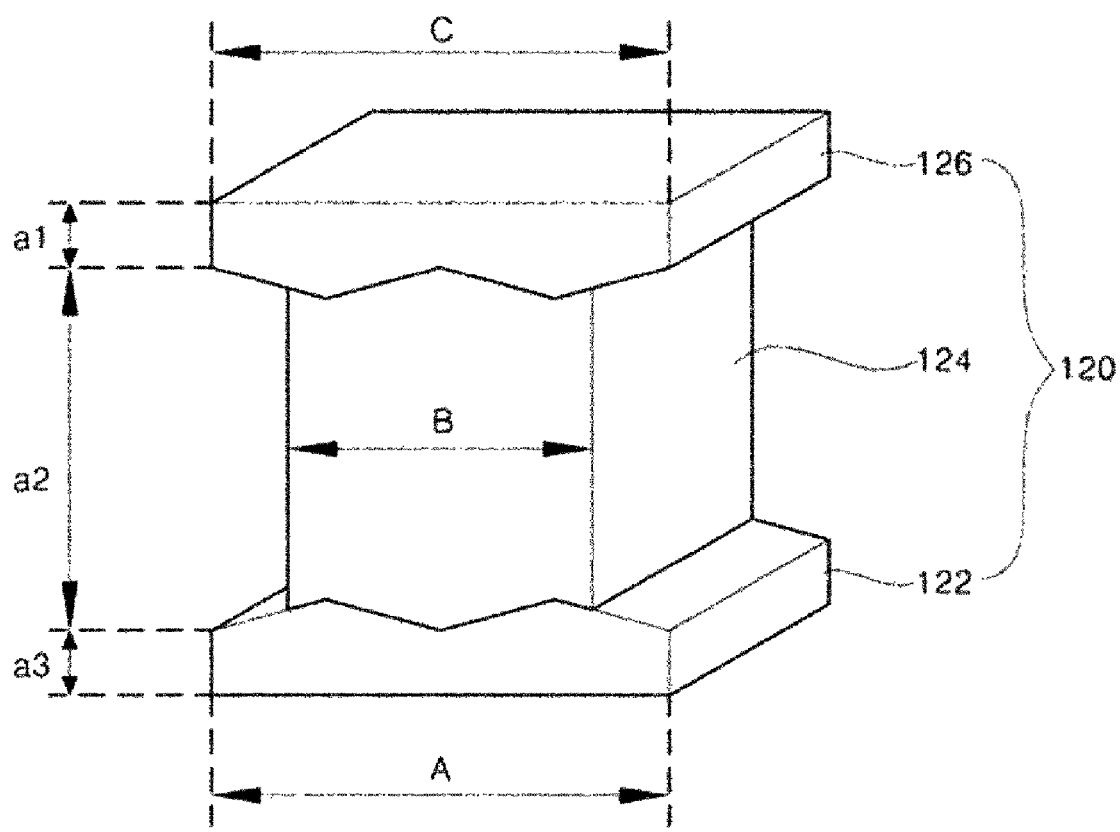
FIG. 1 is a concept view of a thermoelectric element according to an embodiment of the present invention.

Hereinafter, configurations and operations according to embodiments of the present invention will be described in detail with reference to the attached drawings. Throughout the description referencing the attached drawings, like reference numerals refer to like elements, and repetitive descriptions thereof will be omitted. Although terms such as first, second, and the like may be used to describe various elements, the elements are not limited by the terms. The terms are used only for distinguishing one element from other elements.

Figure 2:
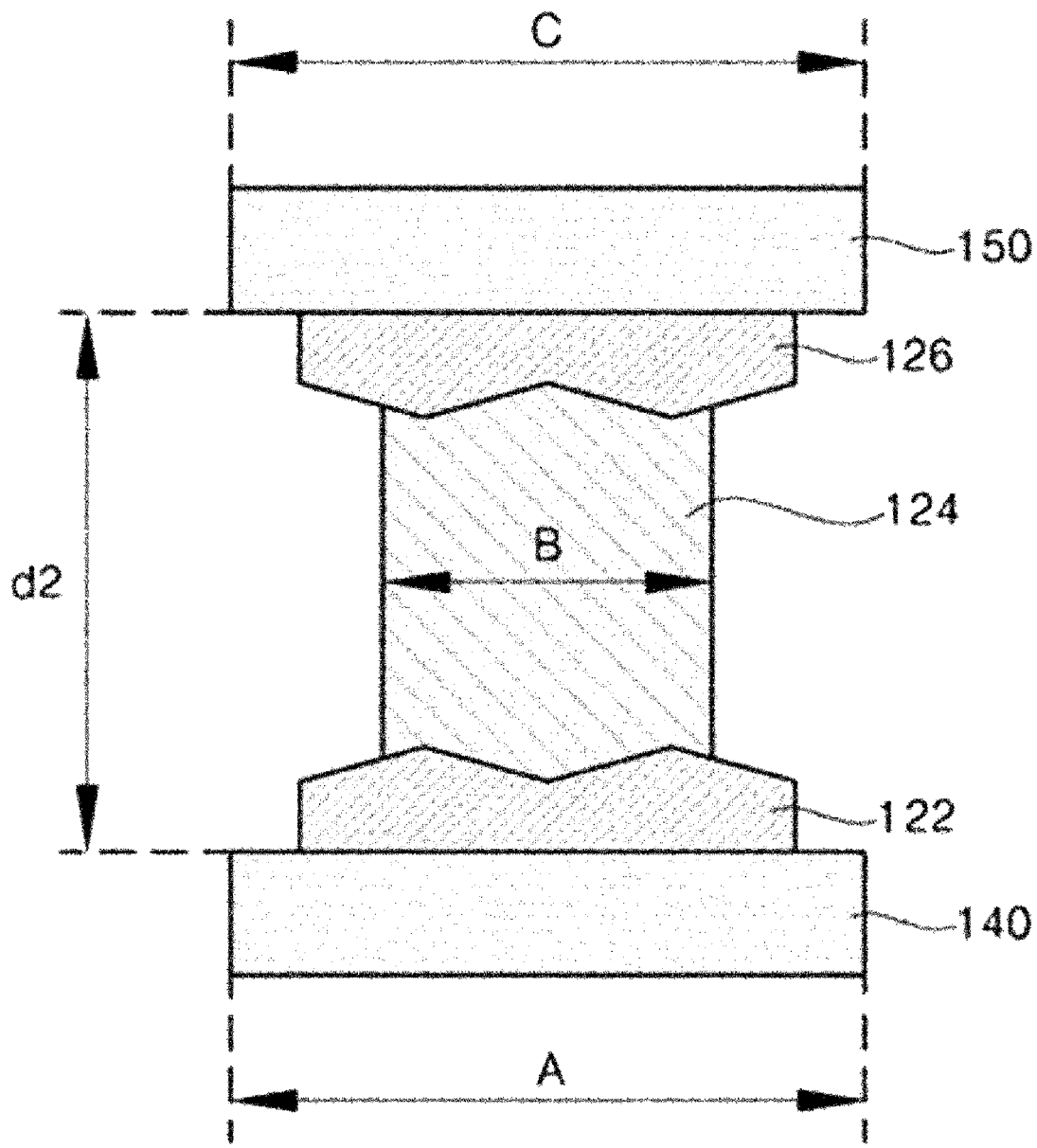
FIG. 2 is a cross-sectional view of a thermoelectric module including the thermoelectric element according to an embodiment of the present invention.

FIG. 1 is a concept view of a thermoelectric element according to an embodiment of the present invention, and FIG. 2 is a cross-sectional view of a thermoelectric module including the thermoelectric element according to an embodiment of the present invention.

Referring to FIGS. 1 and 2, the thermoelectric module according to the embodiment of the present invention includes a first substrate 140, a thermoelectric element 120 disposed on the first substrate 140, and a second substrate 150 disposed on the thermoelectric element 120, and the thermoelectric element 120 includes a first element portion 122 disposed on the first substrate 140 and having a first cross section area, a connection portion 124 connected to the first element portion 122, and a second element portion 126 connected to the connection portion 124, disposed between the second connection portion 124 and the second substrate 150, and having a second cross section area. Particularly, in this case, a structure in which a cross section of an arbitrary area in a horizontal direction of the connection portion 124 is smaller than a first cross section area and a second cross section area may be provided. Here, the horizontal direction may refer to a direction perpendicular to a direction from the first substrate 140 toward the second substrate 150.

When compared with a structure having a single cross section (for example, a regular hexahedron or a rectangular parallelepiped) using an equivalent material, in the thermoelectric element 120 according to the embodiment of the present invention, since areas of the first element portion 122 and the second element portion 126 may be increased and a length of the connection portion 124 may be increased, it is possible to increase a temperature difference T between the first element portion 122 and the second element portion 126. When the temperature difference between the first element portion 122 and the second element portion 126 is increased, since an amount of free electrons which move between the first element portion (for example, a heating side) and the second element portion 126 (for example, a cooling side) is increased, heating or cooling efficiency is increased.

Accordingly, the thermoelectric element 120 according to the embodiment of the present invention is embodied such that broad horizontal cross sections of the first element portion 122 and the second element portion 126 connected to top and bottom surfaces of the connection portion 124 may be provided and a cross section of the connection portion may be reduced by extending the length of the connection portion 124. Here, the first element portion 122 and the second element portion 126 may be formed in a flat panel structure or another three-dimensional structure. Although not shown in the drawings, the first element portion 122 may have a cross section area which becomes larger as it nears the first substrate 140 and the second element portion 126 may have a cross section area which becomes larger as it nears the second substrate 150.

Particularly, in the embodiment of the present invention, a ratio between a width B of a cross section having the greatest width among horizontal cross sections of the connection portion 124 and a width A or C of a cross section which is the larger cross section of the horizontal cross sections of the first element portion and the second element portion may be embodied to satisfy a range of 1:(1.5 to 4). In a case departing from the range, since heat is conducted from the heating side to the cooling side, power generation efficiency is decreased or heating or cooling efficiency is decreased.

In another embodiment of the structure, the thermoelectric element 120 may be formed such that thicknesses a1 and a3 of the first element portion and the second element portion may be less than a thickness a2 of the connection portion. Here, the thickness may mean a thickness in a direction from the first substrate 140 toward the second substrate 150.

In addition, in the embodiment of the present invention, the first cross section area, which is the horizontal cross section area of the first element portion 122, and the second cross section area, which is the horizontal cross section area of the second element portion 126, may be embodied to be different. This is for easily controlling a desirable temperature difference by adjusting thermoelectric efficiency. In addition, the first element portion, the second element portion, and the connection portion may be configured to be integrated, and in this case, components thereof may be formed of the same material. For this, the first element portion 122, the second element portion 126, and the connection portion 124 may be formed through extrusion or by using a mold.

The thermoelectric element 120 according to the embodiment of the present invention may include a P-type semiconductor material or an N-type semiconductor material. An N-type thermoelectric element including the N-type semiconductor material may be formed by using a mixture in which a bismuth telluride (BiTe)-based main material which includes selenium (Se), nickel (Ni), aluminum (Al), copper (Cu), silver (Ag), lead (Pb), boron (B), gallium (Ga), tellurium (Te), bismuth (Bi), and indium (In), and Bi or Te corresponding to 0.001 to 1.0 wt % of an overall weight of the main material are mixed. Additionally, a P-type thermoelectric element including an P-type semiconductor material may be formed using a mixture in which a bismuth telluride (BiTe)-based main material which includes antimony (Sb), nickel (Ni), aluminum (Al), copper (Cu), silver (Ag), lead (Pb), boron (B), gallium (Ga), tellurium (Te), bismuth (Bi), and indium (In), and Bi or Te corresponding to 0.001 to 1.0 wt % of an overall weight of the main material are mixed.

Figure 3:
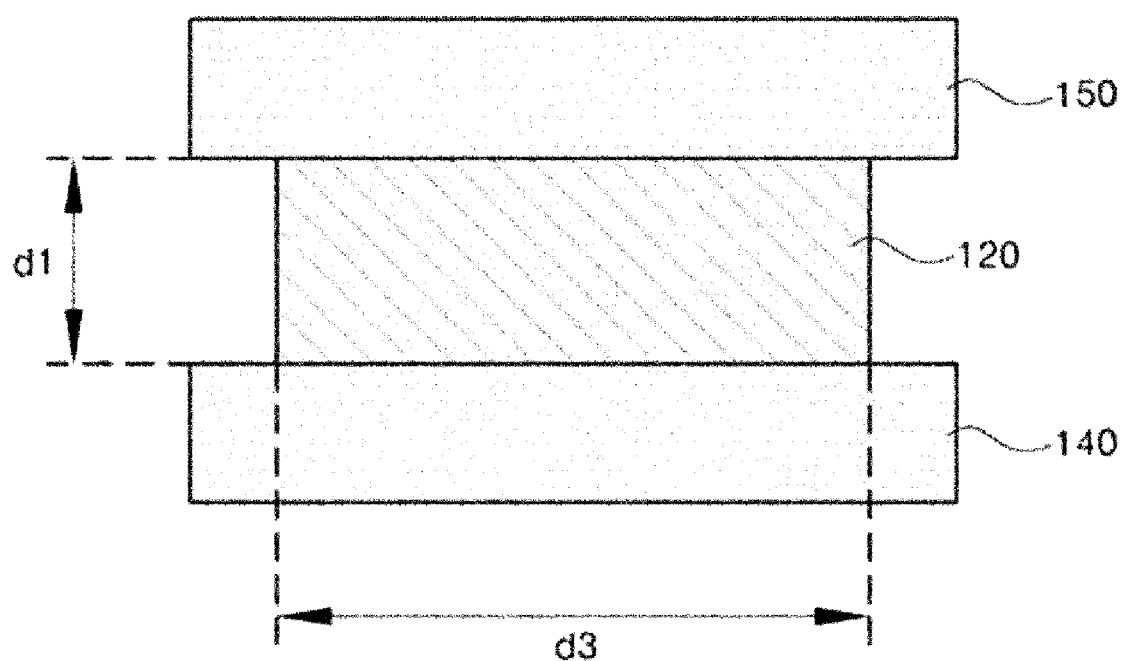
FIG. 3 is a cross-sectional view of a thermoelectric module including a general thermoelectric element.

FIG. 3 is a cross-sectional view of a thermoelectric module including a general thermoelectric element.

Referring to FIG. 2, which illustrates the thermoelectric module including the thermoelectric element according to the embodiment of the present invention, and FIG. 3, which illustrates a thermoelectric module including a general thermoelectric element, it is assumed that a structure in which the thermoelectric element 120 is disposed between a pair of substrates 140 and 150, which have the same widths and thicknesses and face each other, and an equivalent amount of materials is applied to the thermoelectric element 120 is provided.

In this case, a thermoelectric element having a height d1 and a width d3 is embodied using a normally provided amount of thermoelectric material in a general structure shown in FIG. 3, and a thermoelectric element having a height d2 is embodied using an equivalent amount of thermoelectric material in FIG. 2. For example, when it is assumed that a ratio between the height d1 and the width d3 is 0.5:5 in FIG. 3, a ratio between the height d2 and a width may be 2:1.5 when using an equivalent amount of thermoelectric material in FIG. 2. Since the height is increased even though the width is reduced to a degree of 1.5 times, the temperature difference T between the pair of substrates may be embodied to be 1.2 times or more a general reference.

TABLE 1

| | Input heat flux (kW/m$^2$) | ΔT | Amount of generated power (normalized) |
|---|---|---|---|
| Structure of FIG. 3 | 1.5 | 65 | 0.75 |
| Structure of FIG. 2 | 1.5 | 80 | 1 |

In Table 1, a temperature difference and an amount of power generated embodied for each element due to power input per unit area in the structures of FIGS. 2 and 3 are compared. When an equivalent amount of thermoelectric material is used, the temperature difference in the embodiment increases by 1.2 times that of an existing structure and the amount of power generated also increases by 1.3 times that of the existing structure.

Figure 4:
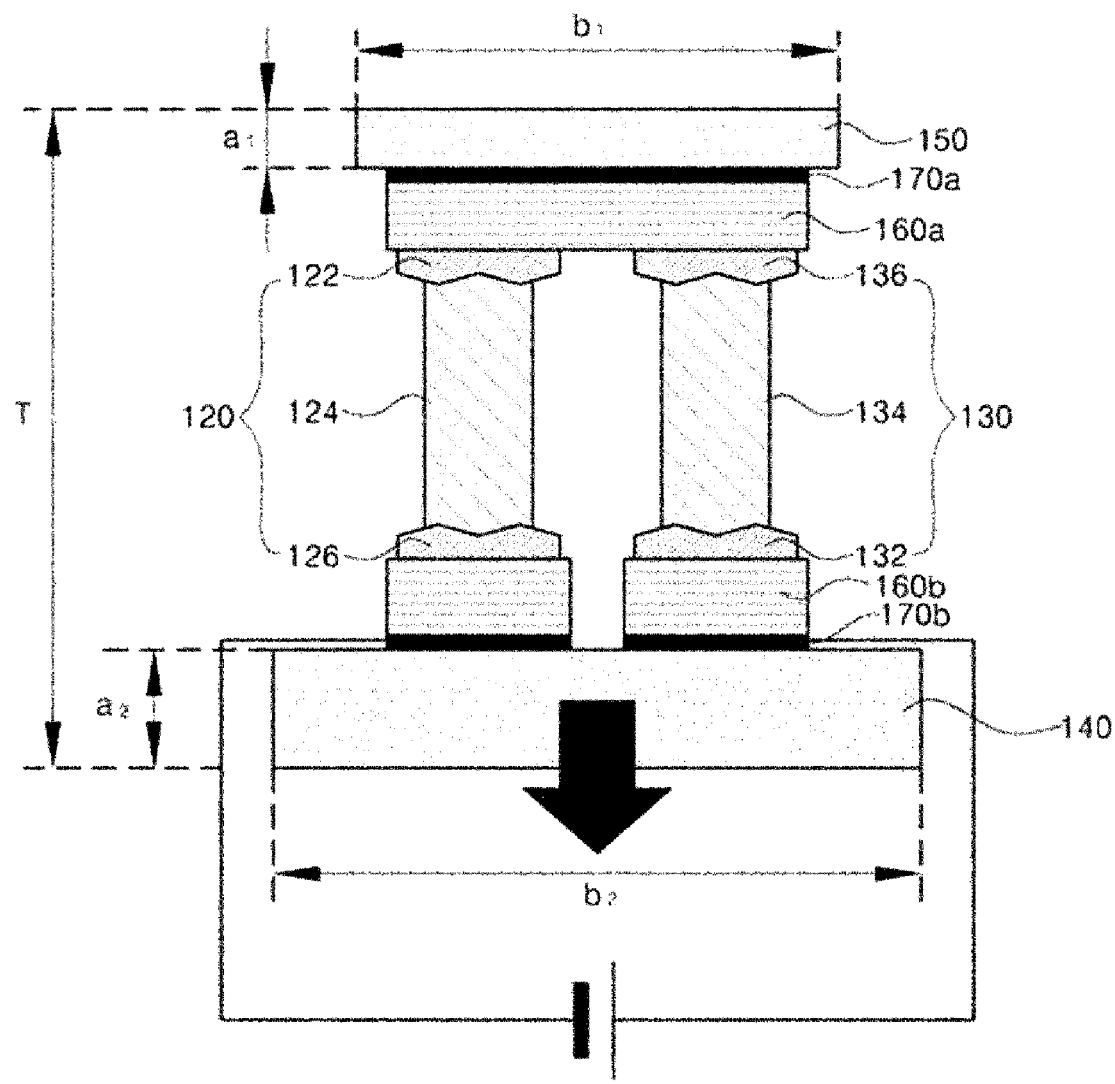
FIG. 4 is a cross-sectional view of the thermoelectric module including the thermoelectric element according to an embodiment of the present invention.
Figure 5:
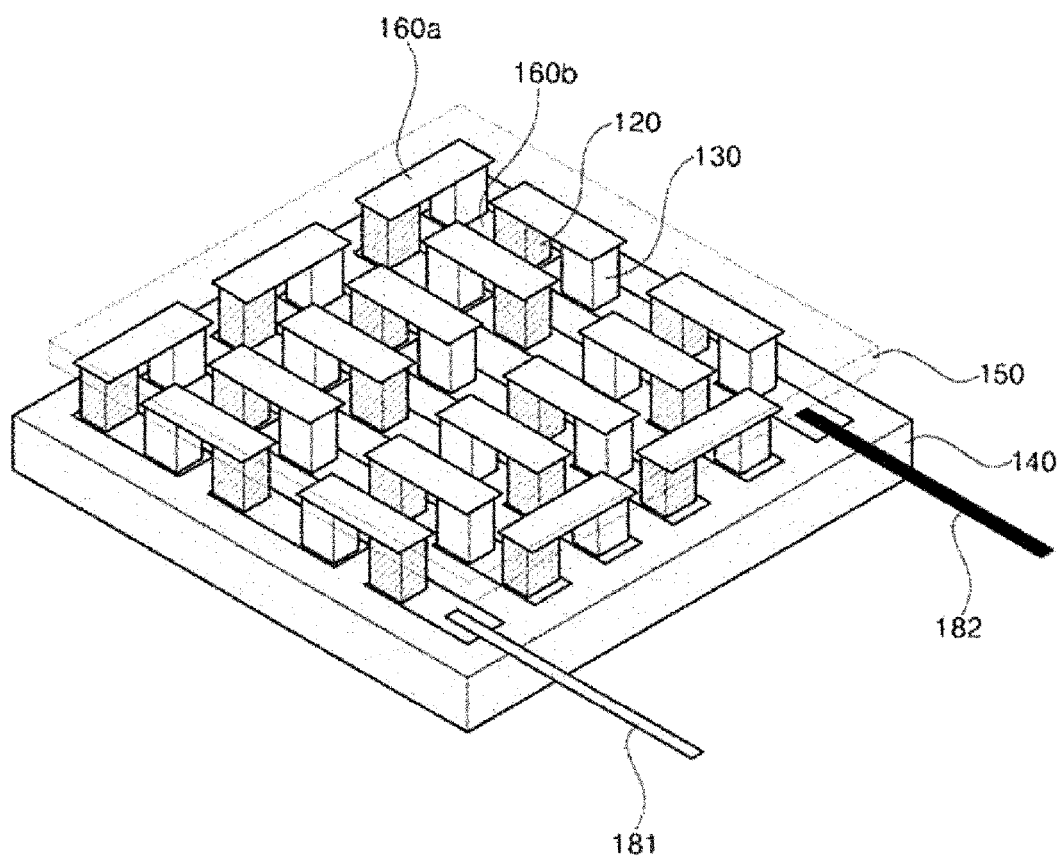
FIG. 5 illustrates a thermoelectric apparatus including the thermoelectric module of FIG. 4.

FIG. 4 is a cross-sectional view of a thermoelectric module including the thermoelectric element according to an embodiment of the present invention, and FIG. 5 illustrates a thermoelectric apparatus including the thermoelectric module of FIG. 4.

Referring to FIGS. 4 and 5, the thermoelectric module according to the embodiment of the present invention includes the first substrate 140 and the second substrate 150, which face each other, and a first semiconductor device 120 and a second semiconductor device 130 disposed between the first substrate 140 and the second substrate 150, and the first semiconductor device 120 and the second semiconductor device 130 are electrically connected. For this, a first electrode 160b disposed between the first substrate 140 and the first semiconductor device 120 and between the first substrate 140 and the second semiconductor device 130, and a second electrode 160a disposed between the second substrate 150 and the first semiconductor device 120 and between the second substrate 150 and the second semiconductor device 130 may be further included.

In this case, the first semiconductor device and the second semiconductor device may be the thermoelectric elements described above with reference to FIGS. 1 and 3. That is, the first semiconductor device 120 and the second semiconductor device 130 shown in FIGS. 4 and 5 (that is, a P-type thermoelectric element and an N-type thermoelectric element) may include connection portions 124 and 134 and first element portions 122 and 132 and second element portions 126 and 136 which are connected to top and bottom surfaces of the connection portions 124 and 134 and configured to have widths (cross section areas) greater than widths of the connection portions.

In the above-described structure, when an equivalent amount of material is applied, power-generation efficiency or heat conversion efficiency may be increased as described above.

In addition, the thermoelectric module including the thermoelectric element according to the embodiment of the present invention may include the first substrate and the second substrate having different volumes as well as the thermoelectric element having the structure shown in FIG. 1. In the embodiment of the present invention, "volume" is defined as referring to an internal volume formed by an outer circumferential surface of a substrate.

Here, the first semiconductor device 120 may be a P-type semiconductor device, the second semiconductor device 130 may be an N-type semiconductor device, and the first semiconductor device and the second semiconductor device may be connected to the metal electrodes 160a and 160b. When power is supplied to a plurality of such first semiconductor devices 120 and a plurality of such second semiconductor devices 130 from circuit lines 181 and 182 through media of the electrodes 160a and 160b, Peltier's effect occurs.

Particularly, in the embodiment of the present invention, due to Peltier's effect, heat conductivity may be increased by forming an area of the first substrate 140 which forms a hot side to be greater than an area of the second substrate 150 which forms a cold side, and a heat sink in a general thermoelectric module may be removed due to the increase in heat emission efficiency.

In detail, in the case of a thermoelectric module for cooling, the first substrate 140 and the second substrate 150 may be insulating substrates, for example, alumina substrates. Otherwise, metal substrates may be used to provide heat emission efficiency or thin films. In the case in which metal substrates are formed, as shown in the drawings, dielectric layers 170a and 170b may be further formed between the electrodes 160a and 160b formed on the first substrate 140 and the second substrate 150. In the case of metal substrates, Cu, a Cu alloy, a Cu—Al alloy, or the like may be applied as the substrate and a thickness for forming thin films may be formed within a range of 0.1 mm to 0.5 mm.

In the embodiment of the present invention, the area of the first substrate 140 may be formed within a range of 1.2 to 5 times the area of the second substrate 150 such that volumes of the substrates are different. In FIG. 4, a width b1 of the second substrate 150 is formed to be smaller than a width b2 of the first substrate 140, and in this case, areas of the substrates having the same thickness differ from each other such that volumes thereof become different.

Here, when the area of the second substrate 150 is formed to be less than 1.2 times that of the first substrate 140, since there is no great difference from existing heat emission efficiency, thin films signify nothing. When the area of the second substrate 150 is more than 5 times that of the first substrate 140, it is difficult to maintain a shape of thermoelectric module (for example, a structure in which the substrates face each other) and heat transfer efficiency is notably decreased.

In addition, in the case of the first substrate 140, a heat emitting property may be maximized by forming a heat-emitting pattern (not shown), for example, an uneven pattern, on a surface of the first substrate such that an efficient heat emitting property may be provided even without a component of an existing heat sink. In this case, the heat-emitting pattern may be formed on one or both sides of the surface of the first substrate. Particularly, when the heat-emitting pattern is formed on a surface in contact with the first and second semiconductor devices, a heat emitting property and a connection property between the thermoelectric device and the substrate may be improved.

Also, heat may easily flow into the cold side and a heat transfer rate may be increased by forming the thickness a1 of the second substrate 150 to be smaller than the thickness a2 of the first substrate 140.

Also, the dielectric layers 170a and 170b may include a material which is a dielectric material having high heat emitting performance and having heat conductivity of 5 to 10 W/K in consideration of heat conductivity of the thermoelectric module for cooling, and may have thicknesses in a range of 0.01 mm to 0.1 mm.

The electrodes 160a and 160b electrically connect the first semiconductor device and the second semiconductor device by using an electrode material such as Cu, Ag, Ni, and the like and form an electrical connection with an adjacent unit cell when a plurality of such unit cells are connected. The thicknesses of the electrodes may be formed within a range of 0.01 mm to 0.3 mm.

Hereinafter, various shapes of a thermoelectric element which is applicable to the thermoelectric module according to the embodiment of the present invention will be described.

1) Bulk Type Semiconductor Device

In the structure shown in FIG. 4, bulk type semiconductor devices formed by using P-type semiconductor materials or N-type semiconductor materials may be applied to the first semiconductor device 120 and the second semiconductor device 130 according to the embodiment of the present invention. A bulk type semiconductor device refers to a structure formed by pulverizing an ingot, which is a semiconductor material, performing a refining ball-mill process on the pulverized ingot, and then cutting a sintered structure. The bulk type semiconductor device may be formed with a single integrated structure.

An N-type semiconductor device may be formed using a mixture in which a bismuth telluride (BiTe)-based main material which includes selenium (Se), nickel (Ni), aluminum (Al), copper (Cu), silver (Ag), lead (Pb), boron (B), gallium (Ga), tellurium (Te), bismuth (Bi), and indium (In), and Bi or Te corresponding to 0.001 to 1.0 wt % of an overall weight of the main material are mixed. For example, a Bi—Se—Te material may be prepared as the main material and Bi or Te having a weight corresponding to 0.001 to 1.0 wt % of an overall weight of the Bi—Se—Te material may be added thereto. That is, when 100 g of Bi—Se—Te is input, Bi or Te within a range of 0.001 g to 1.0 g may be additionally mixed therein. As described above, except when a material is added to the main material within the range of 0.001 wt % to 0.1 wt %, heat conductivity is not decreased and electrical conductivity is decreased such that no increase in a ZT value may be expected.

A P-type semiconductor device may be formed using a mixture in which a bismuth telluride (BiTe)-based main material which includes antimony (Sb), nickel (Ni), aluminum (Al), copper (Cu), silver (Ag), lead (Pb), boron (B), gallium (Ga), tellurium (Te), bismuth (Bi), and indium (In), and Bi or Te corresponding to 0.001 to 1.0 wt % of an overall weight of the main material are mixed. For example, a Bi—Sb—Te material may be prepared as the main material and Bi or Te having a weight corresponding to 0.001 to 1.0 wt % of an overall weight of the Bi—Sb—Te material may be added thereto. That is, when 100 g of Bi—Sb—Te is input, Bi or Te within the range of 0.001 g to 1 g may be additionally mixed therein. Except when a material is added to the main material within the range of 0.001 wt % to 0.1 wt %, heat conductivity is not decreased and electrical conductivity is decreased such that no increase in the ZT value may be expected.

2) Thermoelectric Element having Stacked Structure

In another embodiment of the present invention, instead of the bulk type structure, the semiconductor device may be embodied as a stacked structure to reduce a size and to further increase cooling efficiency.

In detail, the structures of the first semiconductor device 120 and the second semiconductor device 130 in FIG. 4 are formed as unit members formed by stacking a plurality of structures in which a semiconductor material is applied to a sheet-shaped base material and the unit members are cut to prevent a loss of material and to increase an electrical-conducting property.

Referring to FIGS. 6(a) to 6(d), FIGS. 6(a) to 6(d) are concept views illustrating a process of manufacturing a unit member having a stacked structure. Referring to FIGS. 6(a) to 6(d), one unit member 110 is formed by preparing a material including a semiconductor material as a paste and forming a semiconductor layer 112 by applying the paste to a base material 111 such as a sheet, a film, and the like. The stacked structure is formed by stacking a plurality of unit members 100a, 100b, and 100c and then cutting the unit members to form the unit thermoelectric element 120. That is, the unit thermoelectric element 120 according to the embodiment of the present invention may be formed as a structure in which a plurality of unit members 110, which are each formed by stacking the semiconductor layer 112 on the base material 111, are stacked.

In the above process, an operation of applying the semiconductor paste to the base material 111 may be embodied using various methods, for example, tape casting, that is, a process in which a slurry is manufactured by mixing a fine semiconductor material powder with an aqueous solvent or a non-aqueous solvent and any one selected from a binder, a plasticizer, a dispersant, a defoamer, and a surfactant and is then formed with a certain thickness on a moving blade or a moving conveyance. In this case, the base material may be a film, a sheet, and the like having a thickness within a range of 10 um to 100, and a P-type material and an N-type material for manufacturing the bulk type element may be applied as they are to the applied semiconductor material.

An operation of aligning and stacking the plurality of unit members 110 may include forming a stacked structure by compressing the unit members 110 at a temperature of 50 to 250° C., and the number of the stacked unit members 110 may be within a range of 2 to 50 in the embodiment of the present invention. Afterward, a cutting operation through which a desirable shape and size are obtained may be performed and a sintering process may be added thereto.

A unit thermoelectric element formed by stacking the plurality of unit members 110 manufactured by the above process may provide uniformity in thickness, shape, and size. That is, since an existing bulk-shaped thermoelectric element is formed by pulverizing, and refined-ball-milling, and cutting an ingot into a sintered bulk structure, there is a large loss of material during the cutting and it is difficult to cut the bulk structure to a uniform size. Also, due to a great thickness, such as 3 mm to 5 mm of the bulk structure, it is difficult to form a thin film. However, since a unit thermoelectric element having a stacked structure according to the embodiment of the present invention is formed by stacking a plurality of sheet-shaped unit members and then cutting the stacked sheets, there is little loss of material. Also, since a material has a uniform thickness, it is possible to provide uniformity of material. A thickness of an overall unit thermoelectric element may be reduced to be 1.5 mm or below, and the unit thermoelectric element may be applied in various shapes. A finally embodied structure may be embodied as a shape in FIG. 6(d) by cutting, like the structure of the thermoelectric element according to the embodiment of the present invention shown in FIG. 1.

Particularly, the process of manufacturing the thermoelectric element according to the embodiment of the present invention may further include an operation of forming a conducting layer on a surface of each of the unit members 110 in the operation of forming the stacked structure of the unit members 110.

Figure 6:
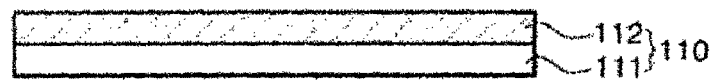
FIGS. 6(a) to 6(d) are concept views illustrating a process of manufacturing a unit member.
Figure 6:
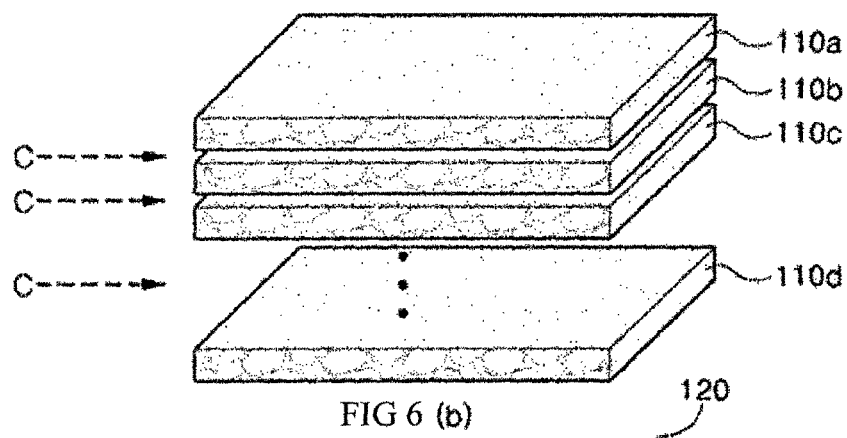
Figure 6:
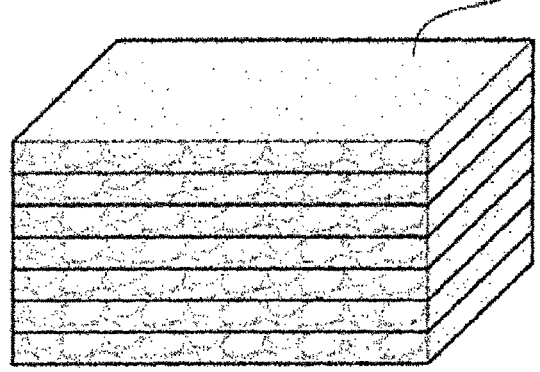
Figure 6:
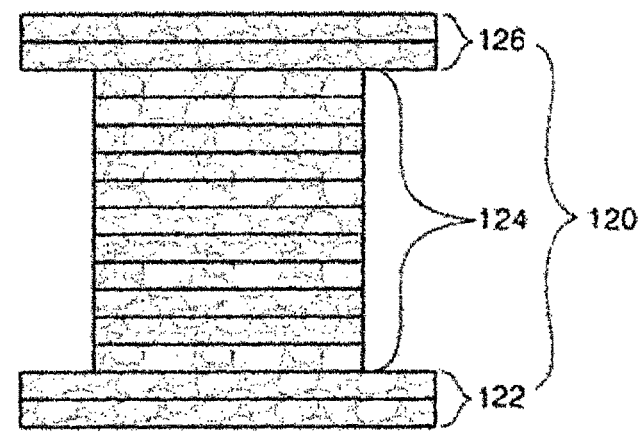

That is, a conducting layer like the structure of FIGS. 7(a) to 7(d) may be formed between the unit members of the stacked structure in FIG. 6(c). The conducting layer may be formed on a surface opposite a base material surface on which a semiconductor layer is formed, and in this case, may be formed as a patterned layer to form an area through which a surface of the unit member is exposed. In comparison to a case of an overall application, electrical conductivity may be increased, adhesion between unit members may be increased, and an advantage of decreasing heat conductivity may be provided.

Figure 7:
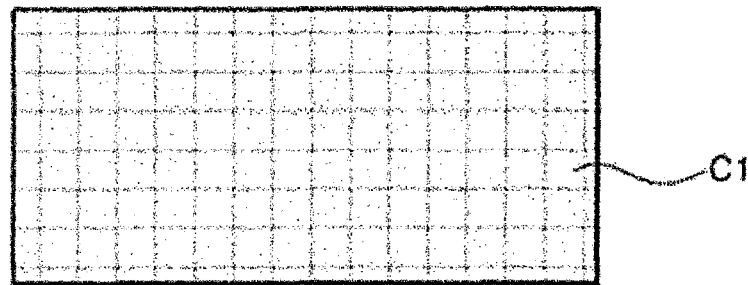
FIGS. 7(a) to 7(d) illustrate various modified examples of a conducting layer according to an embodiment of the present invention.
Figure 7:
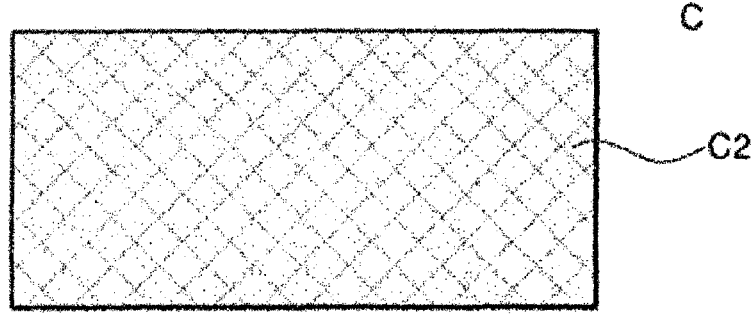
Figure 7:
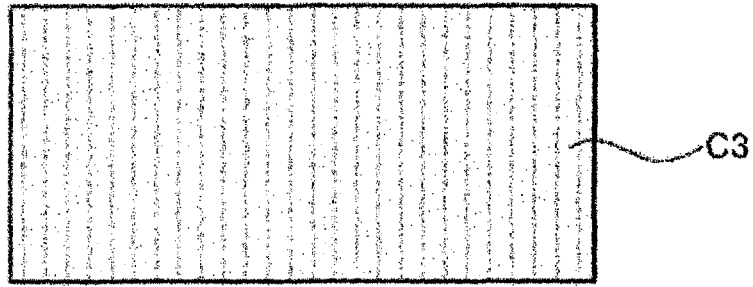
Figure 7:
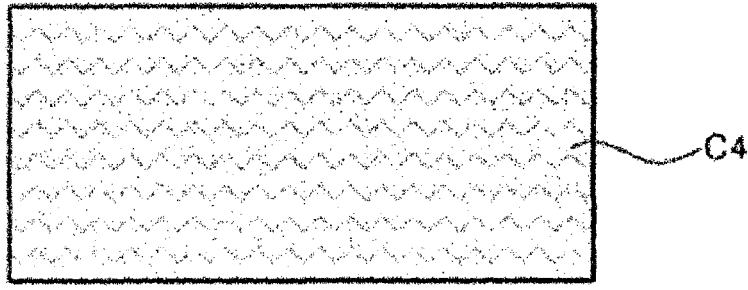

That is, in FIGS. 7(a) to 7(d), various modified examples of the conducting layer C according to the embodiment of the present invention. Here, a pattern through which the surface of the unit member is exposed may be diversely modified and designed as a mesh type structure including closed opening patterns c1 and c2, as shown in FIGS. 7(a) and 7(b), a line type including open opening patterns c3 and c4, as shown in FIGS. 7(c) and 7(d), and the like. The above conducting layer provides advantages of increasing adhesion between unit members in the unit thermoelectric element formed by stacking unit members, decreasing heat conductivity between the unit members, increasing electrical conductivity therebetween, improving cooling capacities Qc and ΔT(OT), and particularly, increasing a power factor by 1.5 times, that is, increasing electrical conductivity by 1.5 times. Since the increase of electrical conductivity is directly connected to an increase of thermoelectric efficiency, cooling efficiency is increased. The conducting layer may be formed of a metal material, and all metal electrode materials such as Cu, Ag, Ni, and the like are applicable thereto.

When a unit thermoelectric element having the stacked structure described above with reference to FIGS. 6(a) to 6(d) is applied to the thermoelectric module shown in FIGS. 4 and 5, that is, when the thermoelectric element according to the embodiment of the present invention is disposed between the first substrate 140 and the second substrate 150 and the thermoelectric module is embodied by a unit cell having a structure including an electrode layer and a dielectric layer, since an overall thickness Th may be formed within a range of 1 mm to 1.5 mm, a remarkable thin film may be embodied when compared to a case in which an existing bulk type element is used.

Figure 8:
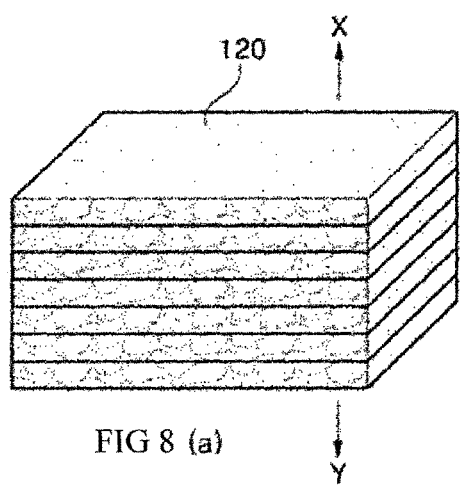
FIGS. 8(a) to 8(c) illustrate a thermoelectric element according to another embodiment of the present invention.
Figure 8:
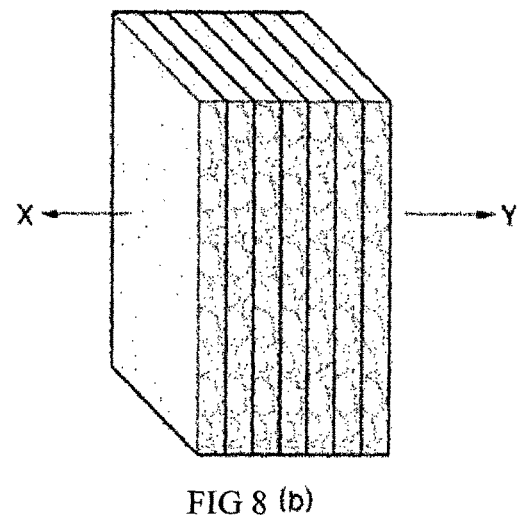
Figure 8:
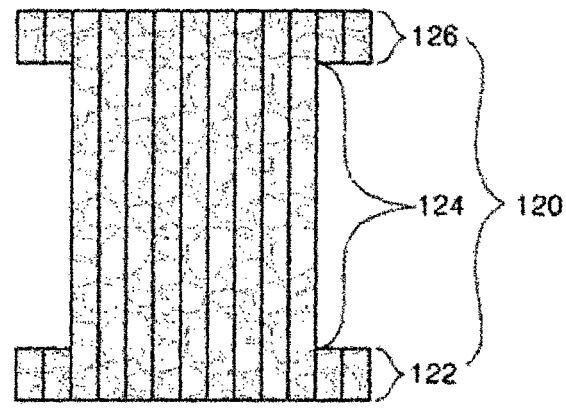

Also, as shown in FIGS. 8(a) to 8(c), the thermoelectric elements 120 and 130 described above with reference to FIGS. 6(a) to 6(d) may be aligned to be horizontally arranged in an upward direction X and a downward direction Y, as shown in FIG. 8(a), and cut, as shown in FIG. 8(c), to provide the thermoelectric element according to the embodiment of the present invention.

The structure shown in FIG. 8(c) may form a thermoelectric module having a structure in which the first substrate, the second substrate, the semiconductor layer, and the surface of the base material are arranged to be adjacent. However, as shown in FIG. 8(b), a structure in which the thermoelectric element itself is vertically upright to allow a side of the unit thermoelectric element to be arranged to be adjacent to the first and second substrates is available. In the above structure, since an end portion of the conducting layer is further exposed at the side than a horizontal arrangement structure and it is possible to simultaneously decrease vertical heat conductivity efficiency and increase electrical conductivity, cooling efficiency may be further increased.

As described above, in the thermoelectric element applied to the thermoelectric module according to the embodiment of the present invention which is provided in various embodiments, the first semiconductor device and the second semiconductor device which face each other have the same shape and size. However, in this case, in consideration of a difference in electrical conductivity properties of the P-type semiconductor device and the N-type semiconductor device, which acts as a factor that hinders cooling efficiency, a volume of any one of the semiconductor devices may be formed to be different from a volume of the other semiconductor device to improve cooling performance.

That is, forming the volumes of the semiconductor devices which face each other to be different may be performed using methods of forming overall shapes thereof to be different, forming a diameter of a cross section of any one of the semiconductor devices, which have the same height, to be greater than the other semiconductor device and forming heights or diameters of cross sections of the semiconductor devices, which have the same shape, differently from the other semiconductor device. Particularly, thermoelectric efficiency may be improved by forming a diameter of an N-type semiconductor device to be greater than that of a P-type semiconductor device to increase a volume of the N-type semiconductor device.

The thermoelectric element having a variety of structures according to one embodiment of the present invention and the thermoelectric module including the same may be used to cool a power generation module or surfaces of top and bottom substrates by taking heat from a medium such as water, a liquid, and the like, or to heat a particular medium by applying heat thereto according to properties of a heat-emitting portion and a heat-absorbing portion thereof. That is, although a configuration of a cooling apparatus which increases cooling efficiency has been described above as an example of the thermoelectric module according to various embodiments of the present invention, a substrate on the other side of a surface at which cooling is performed may be applied as an apparatus used to heat a medium by using a heating property. That is, the present invention is applicable to an apparatus which provides cooling and heating with a single apparatus.

Detailed embodiments of the present invention have been described above. However, a variety of modifications may be provided without departing from the scope of the present invention. Therefore, the technical concept of the present invention is not limited to and determined by the above-described embodiments, and should be defined by the scope of the following claims and equivalents thereof.

DESCRIPTION OF REFERENCE NUMERALS

110: Unit member
111: Base material
112: Semiconductor layer
120: Thermoelectric element
122: First element portion
124: Connection portion
126: Second element portion
130: Thermoelectric element
132: First element portion
134: Connection portion
136: Second element portion
140: First substrate
150: Second substrate
160a, 160b: Electrode layers
170a, 170b: Dielectric layers
181, 182: Circuit line

The invention claimed is:
1. A thermoelectric module comprising:
a first substrate;
a thermoelectric element disposed on the first substrate; and
a second substrate disposed on the thermoelectric element,
wherein the thermoelectric element comprises:
a first element portion disposed on the first substrate and having a first cross-sectional area;
a connection portion connected to the first element portion; and a second element portion connected to the connection portion, disposed between the connection portion and the second substrate, and having a second cross-sectional area;

wherein the connection portion has a third cross-sectional area, wherein the third cross-sectional area is smaller than at least one of the first cross-sectional area and the second cross-sectional area, wherein the first cross-sectional area increases as the first element portion is distanced from the connection portion, wherein the second cross-sectional area increases as the second element portion is distanced from the connection portion, wherein the first element portion and the second element portion each is formed with two protrusions protruding toward the connection portion and a recess between the two protrusions recessing toward the corresponding first or second substrate, and wherein the first element portion, the second element portion, and the connection portion are formed from stacked unit members and each of the stacked unit members are formed of the same material.

2. The thermoelectric module of claim 1,
wherein the first cross-sectional area and the second cross-sectional area are different.

3. The thermoelectric module of claim 2,
wherein a ratio between a width of the third cross-sectional area of the connection portion and a width of the first cross-sectional area of the first element portion or a width of the cross-sectional area of the second element portion is 1:(1.5 to 4).

4. The thermoelectric module of claim 1,
wherein the first element portion, the second element portion, and the connection portion are integrated.

5. The thermoelectric module of claim 1,
wherein thicknesses of the first element portion and the second element portion are smaller than a thickness of the connection portion.

6. The thermoelectric module of claim 1,
wherein the thermoelectric element is formed by stacking two or more unit members that each include a semiconductor layer on a base material.

7. The thermoelectric module of claim 6,
wherein the thermoelectric element further comprises a conducting layer on adjacent unit members.

8. The thermoelectric module of claim 7,
wherein the conducting layer comprises a pattern that exposes a surface of the unit member.

9. The thermoelectric module of claim 1,
wherein the cross-sectional area of the first element portion increases as the first element portion nears the first substrate,
wherein the cross-sectional area of the second element portion increases as the second element portion nears the second substrate.

10. The thermoelectric module of claim 1, further comprising a first electrode disposed between the first substrate and the thermoelectric element, and a second electrode disposed between the thermoelectric element and the second substrate.

11. The thermoelectric module of claim 1, wherein the thermoelectric element comprises a plurality of P-type thermoelectric elements and a plurality of N-type thermoelectric elements alternately arranged on the first substrate, the thermoelectric module further comprising:
a plurality of first electrodes disposed between the first substrate and the plurality of P-type thermoelectric elements, and between the first substrate and the plurality of N-type thermoelectric elements; and
a plurality of second electrodes disposed between the second substrate and the plurality of P-type thermoelectric elements, and between the second substrate and the plurality of N-type thermoelectric elements.

12. A thermoelectric element comprising:
a first element portion having a first cross-sectional area;
a connection portion connected to the first element portion; and
a second element portion connected to the connection portion and having a second cross-sectional area,
wherein a cross-sectional area of the connection portion is smaller than at least one of the first cross-sectional area and the second cross-sectional area,
wherein the connection portion has a third cross-sectional area,
wherein the first cross-sectional area increases as the first element portion is distanced from the connection portion,
wherein the second cross-sectional area increases as the second element portion is distanced from the connection portion,
wherein the first element portion and the second element portion each is formed with two protrusions protruding toward the connection portion and a recess between the two protrusions recessing toward the corresponding first or second substrate, and
wherein the first element portion, the second element portion, and the connection portion are formed from stacked unit members and each of the stacked unit members are formed of the same material.

13. The thermoelectric element of claim 12, wherein the first cross-sectional area and the second cross-sectional area are different.

14. The thermoelectric element of claim 13,
wherein a ratio between a width of the third cross-sectional area of the connection portion and a width of the first cross-sectional area of the first element portion or a width of the cross-sectional area of the second element portion is 1:(1.5 to 4).

15. The thermoelectric element of claim 12, wherein the first element portion, the second element portion, and the connection portion are integrated.

16. The thermoelectric element of claim 12, wherein thicknesses of the first element portion and the second element portion are smaller than a thickness of the connection portion.

17. The thermoelectric element of claim 12,
wherein the connection portion is disposed between the first element portion and the second element portion.

* * * * *